United States Patent [19]

Antreasyan et al.

[11] Patent Number: 4,873,558
[45] Date of Patent: Oct. 10, 1989

[54] GROUP III-V COMPOUND FIELD EFFECT TRANSISTOR WITH DIFFUSION BARRIER

[75] Inventors: Arsam Antreasyan, Fanwood; Paul A. Garbinski, New Providence; Vincent D. Mattera, Jr., Flemington; Henryk Temkin, Berkeley Heights, all of N.J.

[73] Assignee: American Telephone and Telegraph Company, AT&T Bell Laboratories, Murray Hill, N.J.

[21] Appl. No.: 159,156

[22] Filed: Feb. 23, 1988

Related U.S. Application Data

[63] Continuation-in-part of Ser. No. 13,328, Feb. 11, 1989.

[51] Int. Cl.[4] ................ H01L 29/78; H01L 29/201; H01L 29/46
[52] U.S. Cl. .................... 357/23.2; 357/22; 357/16; 357/65; 357/67; 357/71
[58] Field of Search ............ 357/23.2, 22, 16, 65, 357/67, 71

[56] References Cited

U.S. PATENT DOCUMENTS

| 4,160,261 | 7/1979 | Casey Jr. et al. ............ 357/23.2 |
| 4,479,222 | 10/1984 | Hawrylo ...................... 357/17 |
| 4,568,958 | 2/1986 | Baliga .......................... 357/23.2 |
| 4,593,301 | 6/1986 | Inata et al. .................... 357/22 |
| 4,600,932 | 7/1986 | Norris ............................ 357/22 |
| 4,739,385 | 4/1988 | Bethea et al. ................. 357/16 |

FOREIGN PATENT DOCUMENTS 5412573  1/1979  Japan .................................. 357/22

OTHER PUBLICATIONS

Chang et al., *IEEE Elect. Dev. Letters,* vol. EDL-5 May 84, "Submicrometer . . . Transconductive", pp. 169–171.
Ohata et al. *Inst. Phys. Conf. Ser. No. 63: Chapt. 7* Int. Symp. Gas and Related Compounds, Japan 1981, pp. 353–358.
Itoh et al. *IEEE Trans. on Elec. Dev.* vol. ed. 30, No. 7, 7/83 "X-Band . . . Misfets", pp. 811–815.
Ohata et al. *IEEE Trans. on Elec. Dev.,* vol. ED-27, No. 6, Jun. 80, "Super Low-Noise . . . Structure", pp. 1029–1034.

*Primary Examiner*—Andrew J. James
*Assistant Examiner*—Jerome Jackson, Jr.
*Attorney, Agent, or Firm*—M. J. Urbano

[57] ABSTRACT

Group III-V compound MISFETs include a low-doped diffusion barrier layer disposed between a source/drain contact-facilitating layer and the channel layer.

14 Claims, 1 Drawing Sheet

GROUP III-V COMPOUND FIELD EFFECT TRANSISTOR WITH DIFFUSION BARRIER

CROSS-REFERENCE TO RELATED APPLICATIONS

This application s a continuation-in-part of application Ser. No. 013,328 filed on Feb. 11, 1987, entitled "Field Effect Transistor".

BACKGROUND OF THE INVENTION

This invention relates to field effect transistors (FETs) and, more particularly, to Group III-V compound FETs.

Optoelectronic devices based on the Group III-V compound materials systems have become the building blocks of long wavelength optical communication systems. These devices include lasers, light emitting diodes, photodetectors, field effect transistors (FETs), and integrated combinations such as FET-photodetectors. Hence, the design of high performance InP and/or InGaAs-based FETs has become an attractive target of research; InGaAs because of its high mobility and InP becasue of its high peak and saturation velocities of electrons. In addition, InP has favorable MIS (metal-insulator-semiconductor) interfacial properties which allow the formation of n-channel inversion or accumulation layers on semi-insulating InP. On the other hand, active research and development is also apparent in GaAs/AlGaAs materials both from the standpoint of integrating electronic circuits as well as integrating optoelectronic devices with electronic circuits.

SUMMARY OF THE INVENTION

In accordance with one embodiment of the invention, a FET includes a body having at least a surface layer which is semi-insulating, a low-doped Group III-V compound channel layer disposed on the semi-insulating surface layer, a highly doped Group III-V compound contact-facilitating layer, and a low-doped In-based Group III-V compound diffusion barrier layer disposed between the channel layer and the contact-facilitating layer. Source and drain contacts are disposed on the contact-facilitating layer, and the FET includes gate electrode means for controlling the flow of current in the channel between the source and drain contacts.

In one embodiment, an opening is formed in the contact-facilitating and barrier layers to expose a portion of the channel layer where the gate electrode means is formed. The source and drain electrodes are disposed on the contact-facilitating layer on opposite sides of the opening.

In a preferred embodiment, the FET is a MISFET having an InP channel layer and InGaAs contact-facilitating and barrier layers, and the layers of the FET are grown by trichloride transport vapor phase epitaxy (VPE) so as to realize low levels of doping in the channel layer and in the barrier layer. When operated in the enhancement mode, with a gate length of 1 μm, transconductance values as high as 200 mS/mm were achieved.

In another embodiment, the FET is a MISFET having InGaAs contact-facilitating, barrier and channel layers with an InP-stop-etch layer disposed between the barrier layer and the channel layer.

BRIEF DESCRIPTION OF THE DRAWING

The invention, together with its various features and advantages, can be readily understood from the following more detailed description taken in conjunction with the accompanying drawing, in which.

DETAILED DESCRIPTION

Figure 1:
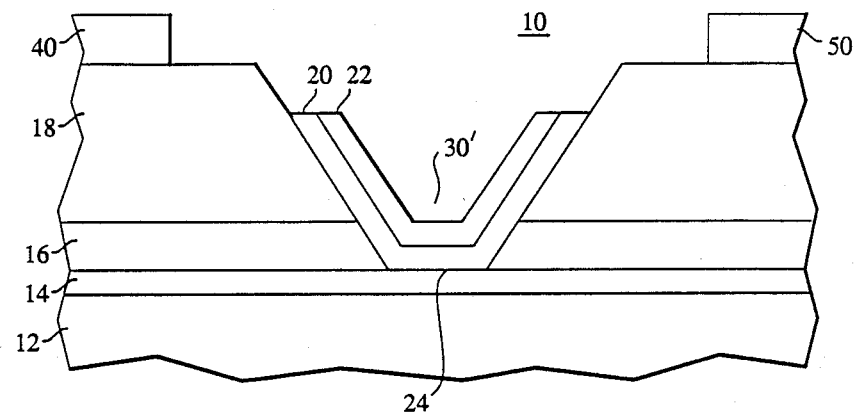
FIG. 1 is a schematic of a MISFET having an InP channel layer in accordance with one embodiment of the invention.

Turning now to FIG. 1, there is shown an enhancement mode FET 10 comprising an InP-based body 12 having at least a semi-insulating surface layer (e.g., a semi-insulating InP substrate or a conducting InP substrate with a semi-insulating epitaxial surface layer grown thereon), a low-doped InP-based channel layer 14 on the semi-insulating surface of body 12, an In-GaAs-based contact-facilitating layer 18, and a low-doped InGaAs-based diffusion barrier layer 16 disposed between the contact-facilitating layer 18 and the channel layer 14. An opening is formed in the InGaAs-based layers 16 and 18 to expose a portion 24 of channel layer 14 where the gate electrode means 30 is to be formed. If an MIS gate structure is used, a dielectric layer 20 is deposited on at least portion 24, and a gate contact 22 is disposed thereon. Source and drain ohmic contacts 40 and 50 are disposed on layer 18 on opposite sides of the opening.

A significant feature of the invention is the interposition of the barrier layer 16 to prevent dopant impurities from diffusing from layer 18, which needs to be highly doped to ensure low resistance ohmic contacts, into the channel layer 14, which needs to be lowly doped to ensure a high resistance between source and drain in the absence of gate voltage. Without the barrier layer 16 in the structure, during epitaxial growth or subsequent high temperature processing, dopant impurities in layer 18 would diffuse into the channel layer 14. After subsequent processing, these impurities in the channel produce an undesirable conducting path between the source and drain when the FET is in its off state.

Preferably, layers 14, 16 and 18 are n-type semiconductors so that conduction in the InP-based channel layer 14 would be by electron flow. In operation, in the absence of a positive voltage applied to the gate relative to the source or drain, the channel is fully depleted and essentially no current flows in the channel layer 14. However, when a positive voltage is applied to gate electrode means 30, an inversion (accumulation) layer is created in the channel and current flows between source and drain.

EXAMPLE

This example describes the fabrication and operation of an InP/InGaAs enhancement mode MISFET in accordance with one embodiment of the invention. Unless otherwise stated, specific materials, parameters, dimensions, operating conditions, ets., are provided by way of illustration only and are not intended to limit the scope of the invention.

The FET included a 1000 Å thick, undoped (i.e., unintentionally doped) InP channel layer 14, a 1000 Å thick undoped $In_{0.53}Ga_{0.47}As$ barrier layer 16, and a 5000 Å thick n-type (S-doped) $In_{0.53}Ga_{0.47}As$ contact-facilitating layer 18 grown by chloride VPE. The undoped layers were n⁻-type and had a background carrier concentration level of n ~$5 \times 10^{14} - 10^{15}$ cm⁻³, while the contact-facilitating layer 18 was n-type and had a carrier concentration of about n ~$10^{17}$ cm⁻³. The body 12 comprised an Fe-doped substrate which was intentionally misoriented by about 6° off the (100) plane toward the nearest <110> orientation. Following a 15 minute pre-heat in the VPE reactor, the substrate was inserted into the growth zone which was at a temperature of about 675° C. and an in-situ etch was carried out. The in-situ etch was terminated at the end of about 6 minutes, and then the undoped InP channel layer growth was begun. Thereafter, the undoped barrier layer was grown, followed by the contact-facilitating layer.

After epitaxial growth was completed, mesas were etched to expose portions 24 of the InP channel layer. Au/Ge/Au source and drain contacts 40 and 50 were formed using a well-known lift-off technique. After alloying the contacts at 420° C., photolithography was utilzed to prepare a photoresist mask for etching a trapezoidally-shaped groove between the source and drain. A stop etchant, $1H_2SO_4:8H_2O_2:8H_2O$ cooled to 3° C., was utilized to etch the groove. Etching stopped as soon as the undoped InP channel layer was exposed. Subsequently, photolithography was repeated to define the gate electrode means 30—a 350 Å thick layer 20 of $SiO_2$ and a TiAu gate contact 22, which were deposited on the portion 24 by electron beam evaporation and defined by well-known lift-off techniques.

As noted above, the undoped InGaAs barrier layer on top of the InP channel layer was used to prevent the S-dopant from back-diffusing from the n-InGaAs contact-facilitating layer into the undoped InP channel layer during crystal growth or subsequent high temperature processing. In addition, because no S-doped InP surface layer was formed, no such surface layer had to be removed from the portion 24 of the channel layer 14. Consequently, channel etching could be, and was, carried out utilizing a single etching step to yield low source-drain channel currents, in the nanoampere range for zero voltage gate bias. In addition, this etching procedure allowed for very short gates. A typical gate width of 250 μm and gate lengths of 1–1.5 μm were chosen. Sub-micron gate lengths are also possible.

For FETs having a gate length of 1 μm transconductance values as high as $g_m = 200$ mS/mm at 300° K. were obtained. FETs with $g_m = 180$ mS/mm had a saturation drift velocity of $3 \times 10^7$ cm/s, which is about twice as high as that in prior art GaAs MESFETs (K. Ohata et al, *IEEE Trans. Electron Dev.*, Vol. ED-27, p. 1079 (1980)), and similar to those obtained in prior art InP MISFETs with submicron gate lengths (T. Itoh et al, *IEEE Trans. Electron Dev.*, Vol. ED-30, p. 811 (1983)). A preliminary measurement of the speed of the MISFETs was carried out. The frequency dependence of the current gain of a MISFET was measured by a spectrum analyzer; a unity gain bandwidth $f_T \sim 6$ GHz was measured and approximately 10 dB gain was observed up to 4 GHz. In addition, FETs in accordance with the invention had typical threshold voltages of 0.43 V. Utilizing the experimentally measured dependence of the low field channel conductance from the gate voltage, an effective mobility of 2700 cm²/Vs in InP at 300° K. was calculated, which is about twice as high as that reported in InP MISFETs previously by K. Ohata et al, *Proc. 1981 Symp. GaAs and Related Compounds*, p. 353 (1982).

A significant factor contributing to the high performance of these FETs may be the preparation of the gate dielectric 20 at room temperature by the deposition of high purity $SiO_2$ in a high vacuum, electron beam evaporator. It is believed that this procedure results in a reduction of surface defects. We have also gotten good results using plasma-assisted deposition of $SiN_x$ instead of $SiO_2$. Furthermore, the addition of the undoped InGaAs barrier 16 layer provides the ability to obtain extremely low drain source leakage currents (in the nanoampere range) at zero voltage gate bias by means of a noncritical, selective etchant.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although the foregoing example utilized InP and InGaAs layers, it is contemplated that other In-based Group III–V compound materials may also be suitable (e.g., InP-based materials, and/or InGaAs-based materials such as InGaAsP and/or AlInAs) as well as GaAs-based Group III–V compound materials (e.g., GaAs, AlGaAs).

Figure 2:
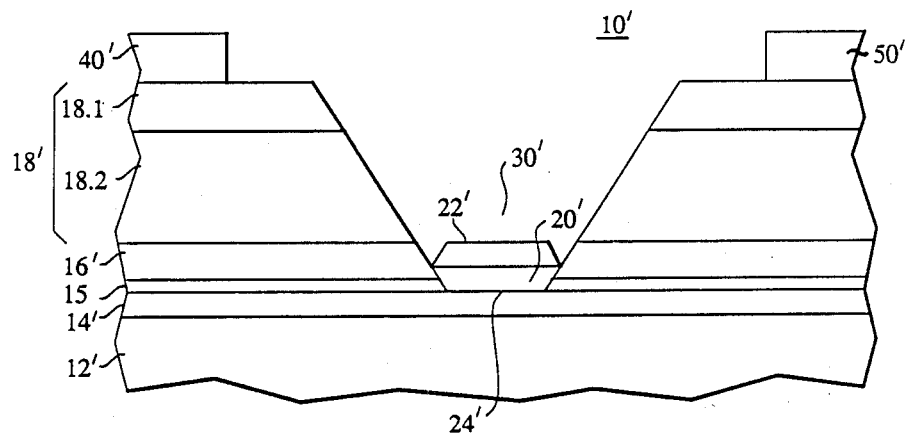
FIG. 2 is a schematic of a MISFET having an In-GaAs channel layer in accordance with another embodiment of the invention.

Thus, another embodiment of the invention is shown in FIG. 2 where components corresponding to those of FIG. 1 have been given identical numerals but with primed notation. In this case, the body 12' has at least a semi-insulating surface layer, and epitaxially grown thereon, in the order recited are: a low-doped InGaAs-based channel layer 14' (which need not be lattice-matched to InP), an InP stop-etch layer 15, a low-doped InGaAs-based barrier layer 16', and an InGaAs-based contact-facilitating layer 18'. The latter may be a composite of a more highly doped layer 18.1 (e.g., $5 \times 10^{17}$ cm⁻³) and a lower doped layer 18.2 (e.g., $10^{18}$ cm⁻³). The source and drain ohmic contacts 40' and 50' are as in FIG. 1, but the gate electrode means 30' (dielectric layer 20' and gate contact 22') is deposited on the bottom of the opening and not to any significant extent on the sides thereof, thereby reducing device capacitance.

This type of gate electrode means and/or composite contact-facilitating layer can also be used in the configuration of FIG. 1. Indeed, when they were so employed in a MISFET having an InP channel layer and a 1 μm gate length, a current gain cut-off frequency of 38 GHz and an electron velocity of $2.5 \times 10^7$ cm/s were measured. This result represents the fastest InP-based FET ever demonstrated, and surpasses state-of-the-art AlGaAs/GaAs modulation-doped FETs having a similar gate length.

These FETs can function as an amplifier of a current signal supplied to the source or drain. The source of the signal might be, for example, an integrated photoconductive detector or an integrated photodiode. The latter combination is commonly referred to as PINFET.

Finally, it should be noted that FETs in accordance with the invention can also be modulation-doped structures well known in the art. Such structures are also known as selectively-doped heterojunction transistors (SDHTs) and high electron mobility transistors (HEMTs). For example, in FIG. 2, InP layer 15 would not be bifurcated; instead it would extend under the dielectric layer 20' and form the source of electrons for the undoped channel layer 15. Alternatively, dielectric layer 20' could be omitted and gate contact 22' could form a Schottky barrier. In addition, a second doped InP layer (not shown) could be positioned between body 12' and channel layer 14' to form a single quantum well device known as an SQW-SDHT.

What is claimed is:

1. A field effect transistor comprising
a body having at least a surface layer which is semi-insulating, characterized by
a low-doped Group III–V compound epitaxial channel layer disposed on the semi-insulating surface layer,
a highly-doped Group III–V compound epitaxial contact-facilitating layer,
a low-doped Group III–V compound epitaxial barrier layer disposed between said channel and contact-facilitating layers and being sufficiently thick so as to prevent dopant impurities from diffusing from the latter into the former,
said channel layer having a bandgap not less than that of said contact-facilitating layer and said barrier layer,
means forming source and drain contacts to said contact-facilitating layer, and
gate electrode means for controlling the flow of current in said channel and between said source and drain contacts.

2. The transistor of claim 1 wherein said channel layer comprises a material selected from the group consisting of InP, InGaAs, and AlInAs, 3. The transistor of claim 2 wherein said material is an In-based Group III–V compound and said contact-facilitating layer and said barrier layer comprise InGaAs.

4. The transistor of claim 3 wherein said channel layer comprises InGaAs and further including an InP layer disposed between said barrier layer and said channel layer.

5. The transistor of claim 4 wherein said InP layer is so disposed only in the regions thereof under said source and drain contacts.

6. A field effect transistor comprising
a body having at least a surface layer which is semi-insulating, characterized by
a low-doped In-based Group III–V compound epitaxial channel layer disposed on the semi-insulating surface layer,
a highly-doped In-based Group III–V compound epitaxial contact-facilitating layer,
a low-doped In-based Group III–V compound epitaxial barrier layer disposed between said channel and contact-facilitating layers and being sufficiently thick so as to prevent dopant impurities from diffusing from the latter into the former,
said channel layer having a bandgap not less than that of said contact-facilitating layer and said barrier layer,
means forming source and drain contacts to said contact-facilitating layer, and
gate electrode means for controlling the flow of current in said channel and between said source and drain contacts.

7. The transistor of claim 6 wherein said channel layer comprises a material selected from the group consisting of InP, InGaAs and AlInAs.

8. The transistor of claim 7 wherein said contact-facilitating layer and said barrier layer comprise InGaAs.

9. The transistor of claim 8 wherein said channel layer comprises InGaAs and further including an InP layer disposed between said barrier layer and said channel layer.

10. A field effect transistor comprising
a body having at least a surface layer which is semi-insulating, characterized by
a low-doped InP-based epitaxial channel layer disposed on the semi-insulating surface layer,
a highly-doped InGaAs-based epitaxial contact-facilitating layer,
a low-doped InGaAs-based epitaxial barrier layer disposed between said channel and contact-facilitating layers and being sufficiently thick so as to prevent dopant impurities from diffusing from the latter into the former,
means forming source and drain contacts to said contact-facilitating layer, and
gate electrode means for controlling the flow of current in said channel and between said source and drain contacts.

11. The transistor of claim 10 wherein said gate electrode means include a groove formed in said InGaAs-based layers which exposes a portion of said channel layer, a dielectric layer disposed on at least said portion and a metal layer disposed on said dielectric layer.

12. The transistor of claim 11 wherein said contact-facilitating means includes an ohmic metal contact to said contact-facilitating layer on each side of said groove.

13. The transistor of claims 10, 11 or 12, wherein said channel and barrier layers have a carrier concentration of $\lesssim 10^{15}$ cm$^{-3}$.

14. An enhancement mode field effect transistor comprising
an InP single crystal body having at least a surface layer which is semi-insulating,
an unintentionally doped InP epitaxial channel layer having a carrier concentration of $\lesssim 10^{15}$ cm$^{-3}$ disposed on said surface layer,
a highly doped n-type $In_{0.53}Ga_{0.47}As$ epitaxial contact-facilitating layer,
an unintentionally doped $In_{0.53}Ga_{0.47}As$ epitaxial barrier layer having a carrier concentration of $\lesssim 10^{15}$ cm$^{-3}$ disposed between said channel layer and said contact-facilitating layer and being sufficiently thick so as to prevent dopant impurities from diffusing from the latter into the former,
said $In_{0.53}Ga_{0.47}$ as layers having a groove extending therethrough and exposing a portion of said channel layer,
source and drain ohmic contacts diposed on said contact-facilitating layer on opposite sides of said groove,
a SiO$_2$ layer disposed on at least said portion, and
a gate metal electrode disposed on said SiO$_2$ layer for controlling the flow of current between said source and drain contacts.

* * * * *